United States Patent
Lin

(12) 
(10) Patent No.: US 6,730,608 B2
(45) Date of Patent: May 4, 2004

(54) FULL IMAGE EXPOSURE OF FIELD WITH ALIGNMENT MARKS

(75) Inventor: Chuang-Chieh Lin, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 234 days.

(21) Appl. No.: 09/904,383

(22) Filed: Jul. 12, 2001

(65) Prior Publication Data

US 2003/0013303 A1 Jan. 16, 2003

(51) Int. Cl.⁷ ............... H01L 21/302; H01L 21/461
(52) U.S. Cl. ................ 438/706; 438/717; 438/725
(58) Field of Search .................. 438/706, 717, 438/725; 33/645; 430/22, 311; 356/399; 250/491.2

(56) References Cited

U.S. PATENT DOCUMENTS 5,705,320 A * 1/1998 Hsu et al. ............... 430/313
5,897,371 A * 4/1999 Yeh et al. ................ 438/633
6,184,104 B1 * 2/2001 Tan et al. ................ 438/401
6,197,481 B1 * 3/2001 Chang et al. ............ 438/314
6,529,274 B1 * 3/2003 Hickman ................. 356/399

OTHER PUBLICATIONS

Wolf et al., Silicon Processing for the VLSI Era, 1986, vol. 1, p. 407, 429.*

* cited by examiner

Primary Examiner—Robert Kunemund
Assistant Examiner—Duy-Vu Deo
(74) Attorney, Agent, or Firm—Tung & Associates

(57) ABSTRACT

A full-image exposure process of a field of a semiconductor wafer having an alignment mark is disclosed. The field of the semiconductor wafer may be located at an edge of the wafer, such as the lower-left or upper-right edge of the wafer, and is exposed using a full-image mask, such as a positive photoresist mask, and that can be inclusive of the alignment mark. A clear out process is subsequently performed around the alignment mark on the field of the semiconductor wafer to reveal the alignment mark. Prior deposition of photoresist or other layers, and subsequent exposure and stripping of the photoresist and etching of the other layers may also be performed.

15 Claims, 11 Drawing Sheets

FULL IMAGE EXPOSURE OF FIELD WITH ALIGNMENT MARKS

FIELD OF THE INVENTION

This invention relates generally to semiconductor processing, and more specifically to the processing of a field of a semiconductor wafer having alignment marks.

BACKGROUND OF THE INVENTION

Deposition and patterning are two of the basic steps performed in semiconductor processing. Patterning is also referred to as photolithography, masking, oxide or metal removal, and microlithography. Patterning enables the selective removal of material deposited on a semiconductor substrate, or wafer, as a result of deposition. For example, as shown in FIG. 1A, a layer 104 has been deposited on a substrate 102. After the photolithography process is performed, as shown in FIG. 1B, some parts of the layer 104 have been selectively removed, such that gaps 106a and 106b are present within the layer 104. A photomask, or pattern, is used (not shown in FIG. 1B) so that only the material from the gaps 106a and 106b are removed, and not the other portions of the layer 104. The process of adding layers and removing selective parts of them, in conjunction with other processes, permits the fabrication of semiconductor devices.

Alignment is critical in photolithography and deposition, as well as in other semiconductor processes. If layers are not deposited properly, or if they are not selectively removed properly, the resulting semiconductor devices may not function, relegating them to scrap, which can be costly. Therefore, alignment marks are placed on the semiconductor wafer for the proper positioning during the deposition and photolithography processes. This is shown in FIG. 2, where the semiconductor wafer 202 has alignment marks, such as the alignment square 204, thereon. When the photomask 206 is positioned over the wafer 202, its own alignment marks, such as the alignment square 208, is aligned with the alignment marks of the wafer 202. For example, the alignment square 208 of the photomask 206 is aligned so that the alignment square 204 of the wafer 202 is centered therein.

For some types of semiconductor processing, alignment marks are placed in two fields, or areas, on opposite edges of the semiconductor wafer. This is shown in FIG. 3. A semiconductor wafer 300 is divided into a number of fields, such as the field 302. Each field corresponds to one or more semiconductor devices, and represents an area of the semiconductor wafer that will be processed at a given time. For instance, a stepper may first process one field, then move on to the next field, and so on. The wafer 300 has an upper-right field 304 and a lower-left field 306 that have alignment marks 308 and 310, respectively. The presence of the alignment marks 308 and 310 on the fields 304 and 306 presents difficulties with semiconductor processing of these fields, however. In particular, the alignment marks 308 and 310 should not be obscured, as may result from their processing, so that proper alignment for subsequent processing can still occur.

A conventional approach to ensure that the alignment marks 308 and 310 are not obscured is to only partially expose the fields 304 and 306 during photolithography, so that the alignment marks 308 and 310 are not exposed. This is shown in FIG. 4. The part of the semiconductor wafer 300 is shown that includes the field 304 having the alignment mark 308. The partial-image mask 402 prevents exposure of the part of the field 304 having the alignment mark 308. The mask 402 is positioned over the field 304, as indicated by the dotted line 404, and the field 304 is exposed. The top part of the mask 402 prevents exposure of the top part of the field 304 that has the alignment mark 308. The bottom part of the mask 402 includes a partial image for the field 304, such that the bottom part of the field 304 is exposed. The mask 402 can be a positive photoresist mask. Partial exposure as shown in FIG. 4 may be accomplished by, for example, blade adjustment of the semiconductor equipment being used.

The partial exposure process of FIG. 4 has disadvantages, however. The resulting dimensions of the semiconductor device(s) of the field 304 defined by the partial exposure may be inaccurate as compared to the dimensions of the devices defined by the full exposure of other fields. These dimensions resulting from subsequent photolithography, etching, and chemical mechanical polishing (CMP). Furthermore, and possibly also causing the poor dimension uniformity, planarization of the unexposed part of the field 304 having the alignment mark 308 is not uniform to the exposed part of the field 304 and other fields adjacent to the field 304. This is shown in FIG. 5. The area 502 of the field 304 corresponds to the part of the field 304 that was exposed, whereas the area 504 of the field 304 corresponds to the part of the field 304 having the alignment mark 308 (not shown in FIG. 5) and which was not exposed, as divided by the dotted line 506. The area 504 has a greater height than the area 502 does, resulting in a lack of planar uniformity.

Therefore, there is a need for exposing the fields of a semiconductor wafer on which there are alignment marks without employing a partial image exposure process. There is a need for such exposure without resulting in poor semiconductor device dimensions. Such exposure should also improve planarization of the parts of the fields having alignment marks, as compared to those parts that do not have alignment marks. For these and other reasons, there is a need for the present invention.

SUMMARY OF THE INVENTION

The invention relates to the full image exposure of a field of a semiconductor wafer on which there is an alignment mark. The field of the semiconductor wafer may be located at an edge of the wafer, such as the lower-left or upper-right edge of the wafer, and is exposed using a full-image mask, such as a positive photoresist mask, and that is preferably inclusive of the alignment mark. A clear out process is then performed around the alignment mark on the field of the semiconductor wafer to reveal the alignment mark. Prior deposition of photoresist or other layers, and subsequent exposure and stripping of the photoresist and etching of the other layers may also be performed.

The invention provides for advantages over the prior art. Because the entire field is exposed, and not just a part of the field as is done in the conventional partial image exposure process, the semiconductor devices fabricated using the invention have greater planar uniformity as compared to the conventional process. More specifically, there is greater planar uniformity between the part of the field in which the alignment mark is located and the rest of the field. This can result in improved dimensions of the resulting semiconductor devices as compared to those when using the conventional process. Still other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 6:
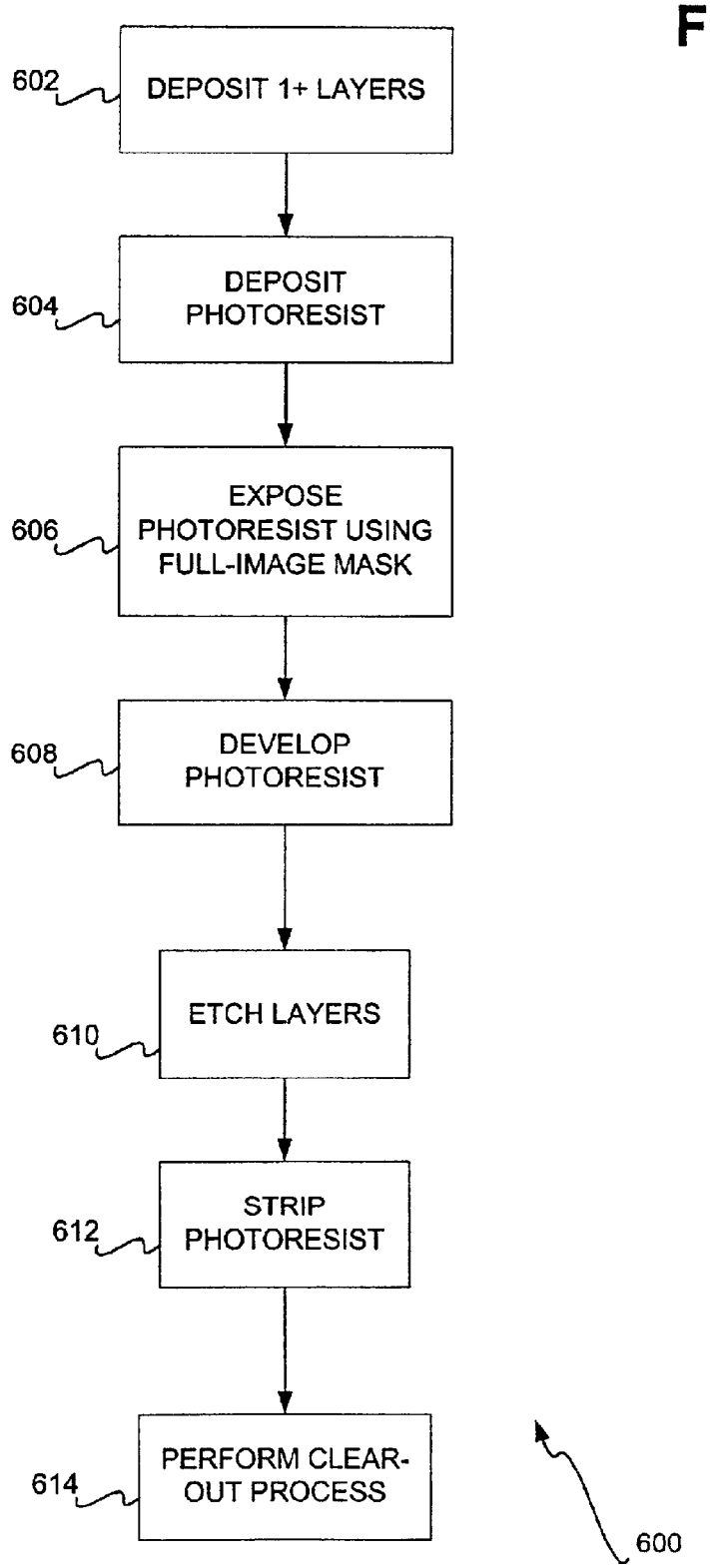
FIG. 6 is a flowchart of a method of an embodiment of the invention.

FIG. 6 shows a method 600 according to an embodiment of the invention. Not all the parts of the method 600 are necessary to perform the invention, however, nor is the order of the parts illustrated in FIG. 6 the only order in which they can be performed. Other parts and processes may also be performed in addition to or in lieu of those shown in FIG. 6. The method 600 can be used to fabricate a semiconductor device according to an embodiment of the invention.

Figure 1A:
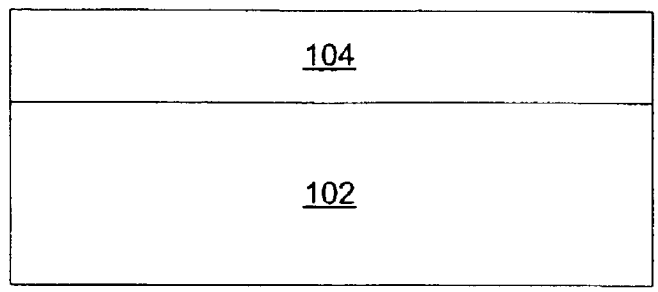
FIGS. 1A and 1B are diagrams showing the effect of patterning on a layer deposited on a semiconductor wafer.
Figure 1B:
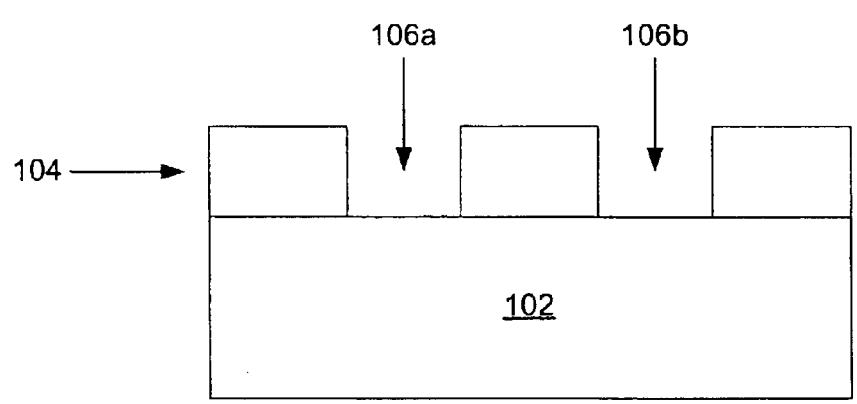
Figure 2:
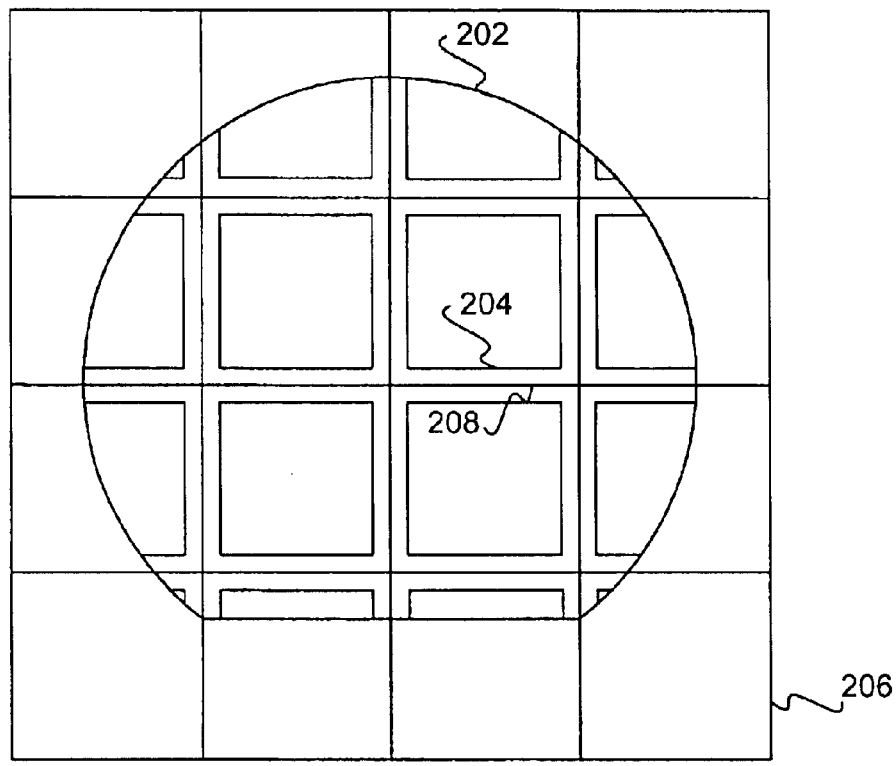
FIG. 2 is a diagram showing the alignment of a mask to a semiconductor wafer.
Figure 3:
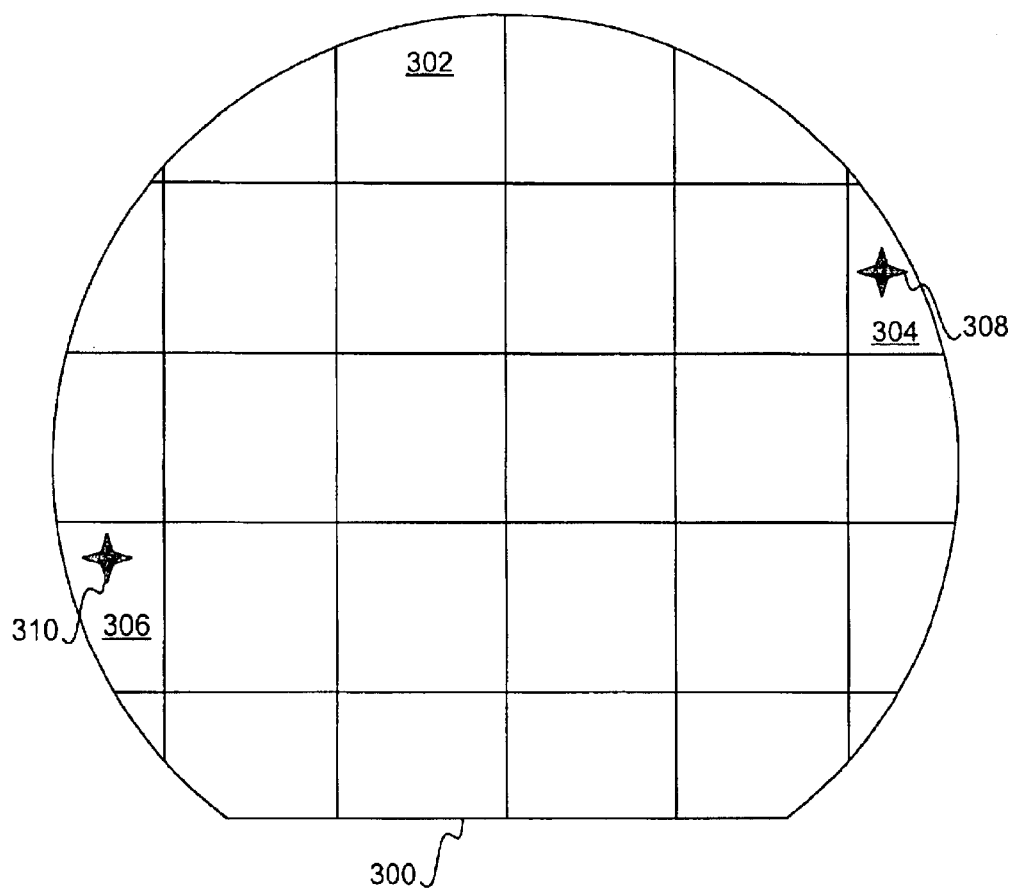
FIG. 3 is a diagram of a wafer showing the alignment marks on two fields at the edge of the wafer.

One or more layers are deposited on the field of a semiconductor wafer having an alignment mark (602). These layers may be silicon layers, metal layers, or other types of layers. The field may be one of the fields 304 and 306 of the wafer 300 of FIG. 3. That is, the field may be located at an edge of the wafer, such as the upper-left or lower-right part of the edge of the wafer. Photoresist is next deposited on the field of the semiconductor wafer (604).

The photoresist is exposed using a full-image mask, such as a positive photoresist mask, that is preferably inclusive of the entire field, including the alignment mark on the field (606). A positive photoresist mask is one in which photoresist is subsequently removed from areas that were not protected from exposure by the opaque regions of the mask, but remains after development in regions that were protected from exposure. That is, a positive image of the mask remains following the development process.

Figure 4:
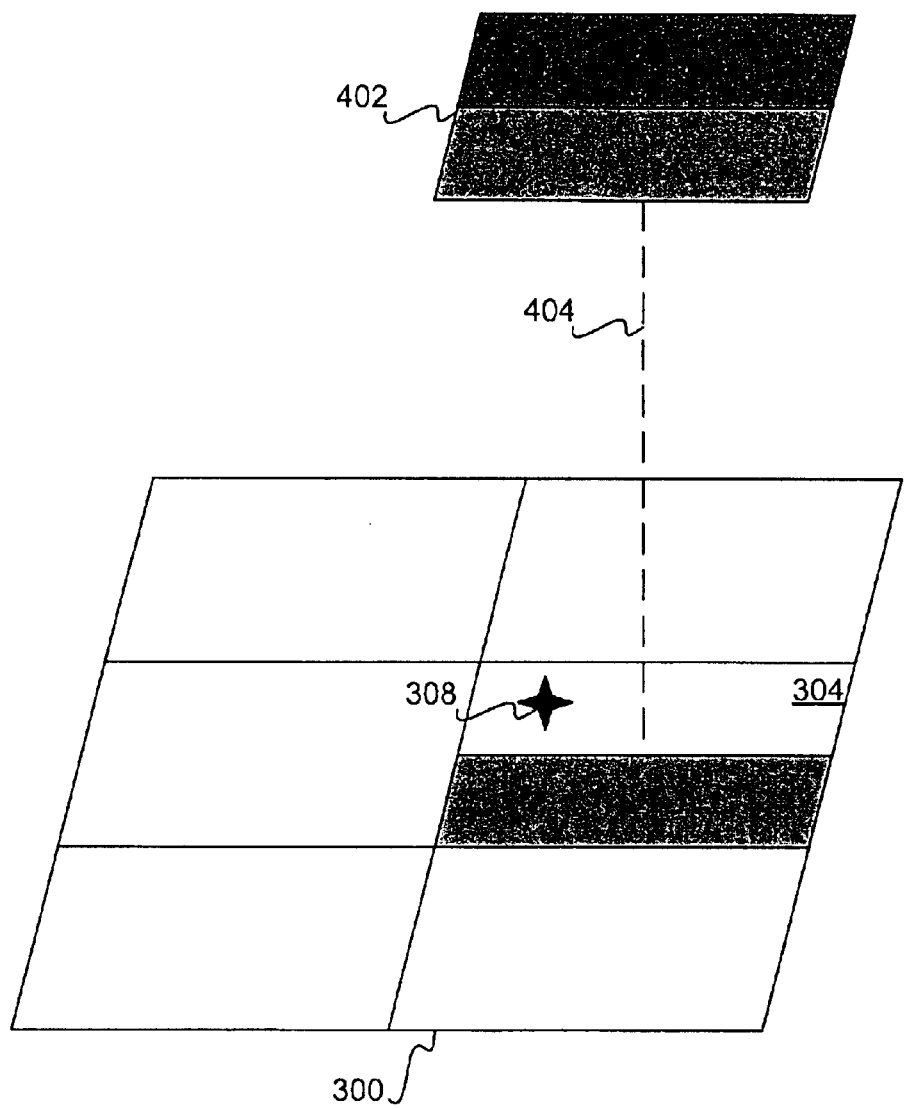
FIG. 4 is a diagram showing the conventional partial image exposure process.
Figure 7:
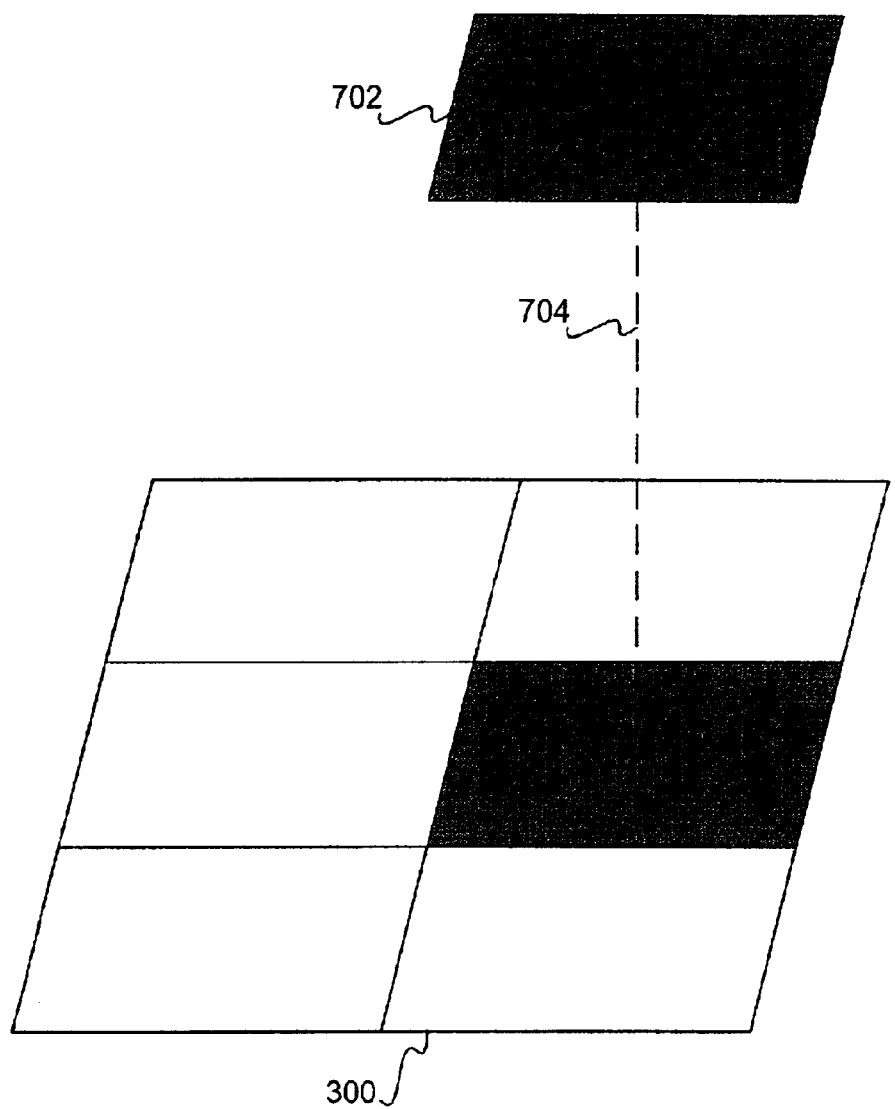
FIG. 7 is a diagram showing the full image exposure process according to an embodiment of the invention.

FIG. 7 shows an example of this full-image exposure process. The part of the semiconductor wafer 300 is shown that includes the field 304. A full-image mask 702 is positioned over the field 304, as indicated by the dotted line 704, and the field 304 is exposed. The full-image mask 702 corresponds to one or more semiconductor devices for the entire field 304, even the area in which the alignment mark 308 is located. This is as compared to the partial-image mask 402 of FIG. 4, in which there are semiconductor device(s) for only the bottom part of the field 304, and not the top part of the field 304 that includes the alignment mark 308. The entire field 304 is thus exposed in FIG. 7, such that the alignment mark 308 in the field 304 is obscured. The mark 308 may also be obscured because of the previous and/or subsequent deposition of the photoresist and/or the other layers. The alignment mark 308 is thus not depicted in FIG. 7.

Referring back to FIG. 6, the photoresist is developed (608). Development of the photoresist removes the photoresist that was exposed. Those parts of the photoresist that were not beneath opaque regions of the full-image mask became polymerized, such that development removes them. Conversely, those parts of the photoresists that were beneath opaque regions of the full-image mask remained unpolymerized, such that they remain even after development. The layers previously deposited can then be etched such that they have a pattern substantially identical to that of the full-image mask and the remaining photoresist (610). After etching, the remaining unpolymerized photoresist that was unexposed is stripped to remove this photoresist (612).

Figure 8A:
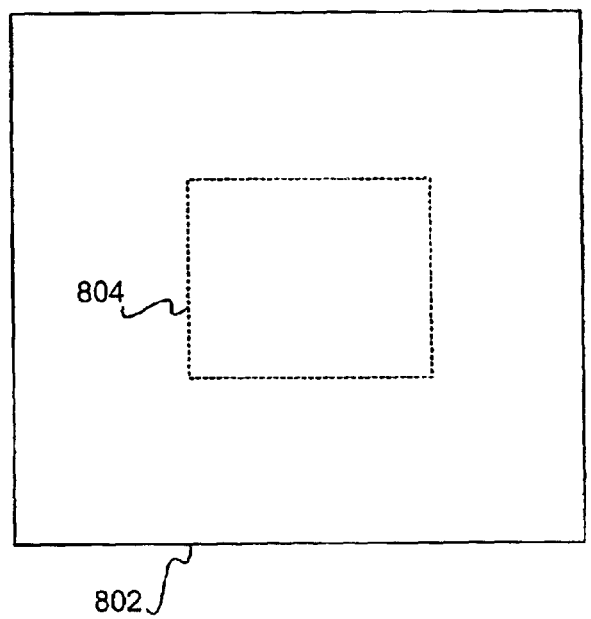
FIGS. 8A and 8B are diagrams showing the effects of a clear out process.
Figure 8B:
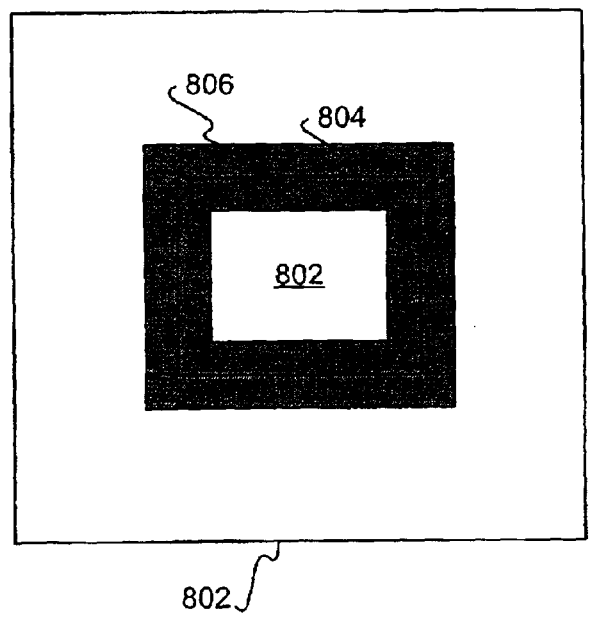

Finally, a clear out process is performed to reveal the alignment mark previously obfuscated by the photoresist deposition and exposure processes (614). The clear out process of 614 may also be performed before 608, 610, and/or 612 of the method 600. A general description of the effects of the clear out process is described with reference to FIGS. 8A and 8B. As shown in FIG. 8A, the alignment marks 804 are hidden from view by the photoresist 802 that have been deposited on the silicon wafer, and are indicated as such as dotted. To maintain the alignment marks 804, a photolithographic clear out process is performed, which clears the photoresist 802 from around the alignment marks 804. The results of the clear out process are shown in FIG. 8B, where a window 806 has been created around the alignment marks 304, exposing the underlying silicon wafer.

Figure 9A:
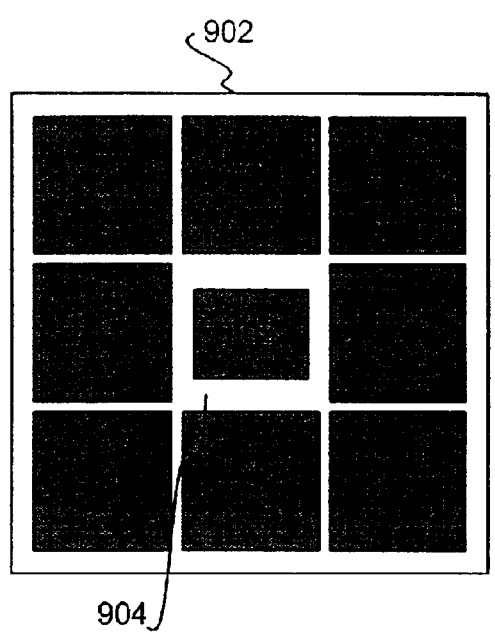
FIGS. 9A and 9B are diagrams showing how the clear out process can generally be formed.
Figure 9B:
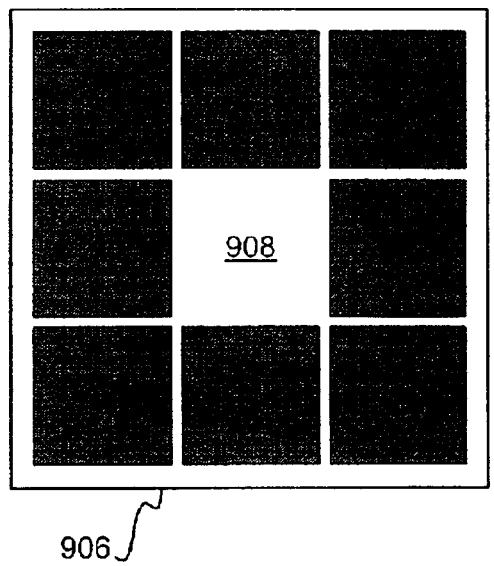

FIGS. 9A and 9B show how the clear out process can generally be performed. In FIG. 9A, a mask 902 is shown that contains an auxiliary pattern 904. The mask 902 can also be a reticle. The auxiliary pattern 904 contains no device circuitry, and surrounds a smaller pattern 905 in order to clear out a specified window area and isolate the smaller pattern 905. In this case, the auxiliary pattern 904 would correspond to the alignment marks 804 of FIG. 8B, such that a part of the photoresist 802 remains surrounded by the alignment marks 804 as shown in FIG. 8B. By comparison, in FIG. 9B, a mask 906 is shown that contains a blank pattern 908, where the mask 906 may also be a reticle. The blank pattern 908 contains no circuitry, and clears out a specified window area, such that no part of the resist 802 of FIG. 8B would remain surrounded by the alignment marks 804 if the blank pattern 908 were used in lieu of the auxiliary pattern 904 of FIG. 9A.

Figure 10:
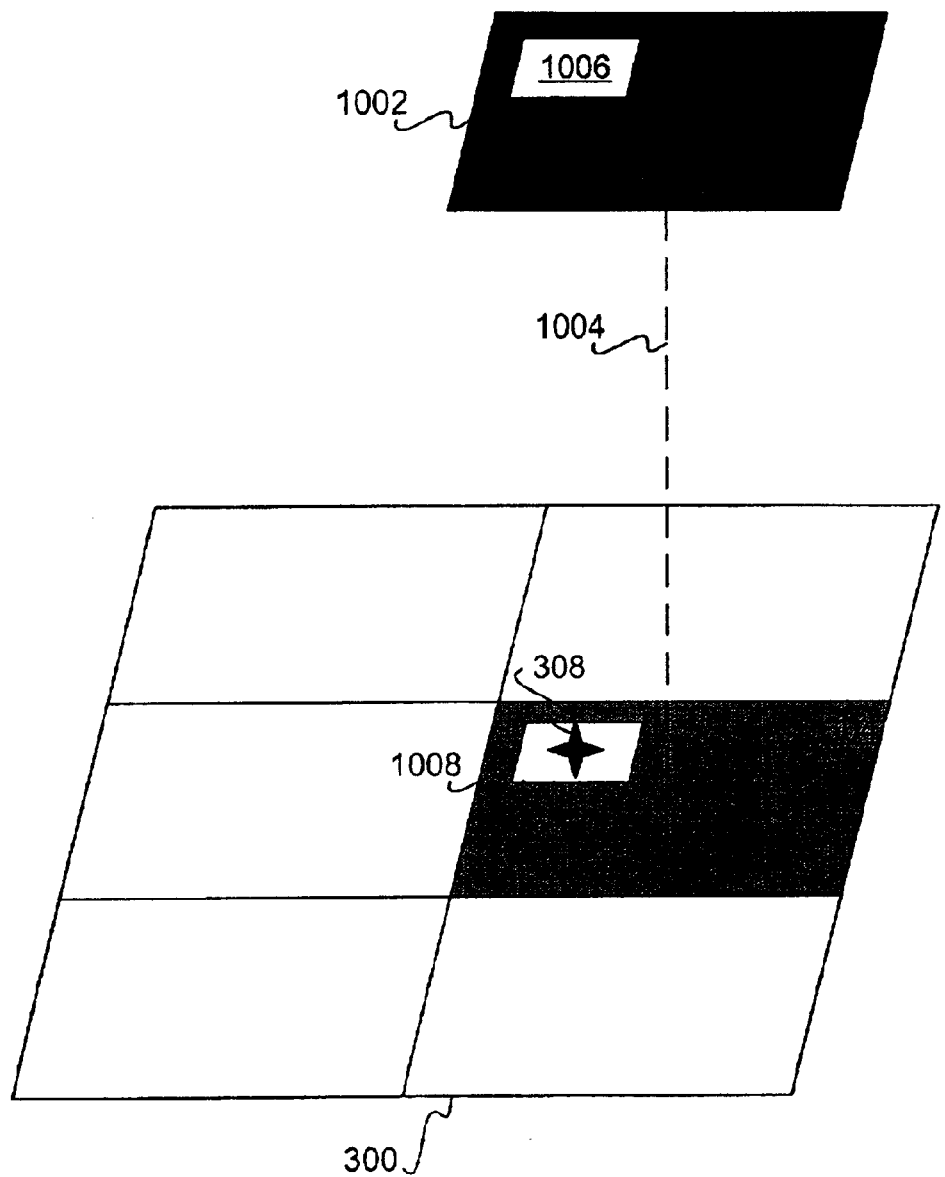
FIG. 10 is a diagram showing the clear out process according to an embodiment of the invention.

FIG. 10 shows an example of the clear out process as applied to the field 304 of the wafer 300 after the full-image exposure process of FIG. 7 has been performed. A preferably full-image mask 1002 is positioned over the field 304, as indicated by the dotted line 1004. The full-image mask 1002 includes a blank pattern 1006 that corresponds to the area 1008 of the field 304 in which the alignment mark 308 is located. The field 304 is then exposed through the mask 1002. This, optionally in conjunction with a subsequent development process, clears out the photoresist from the area 1008 of the field 304, revealing the alignment mark 308. Revelation of the alignment mark 308 is desired for proper positioning of subsequent etching and deposition processes.

Figure 5:
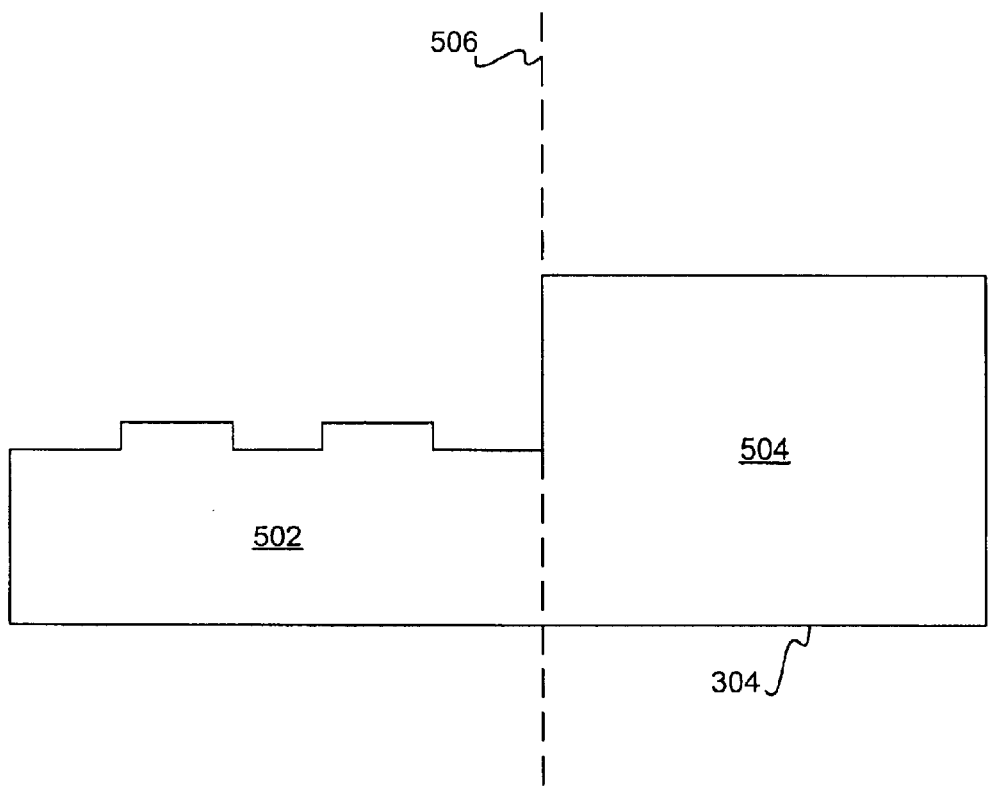
FIG. 5 is a diagram showing the lack of planar uniformity resulting from the conventional partial image exposure process of FIG. 4.
Figure 11:
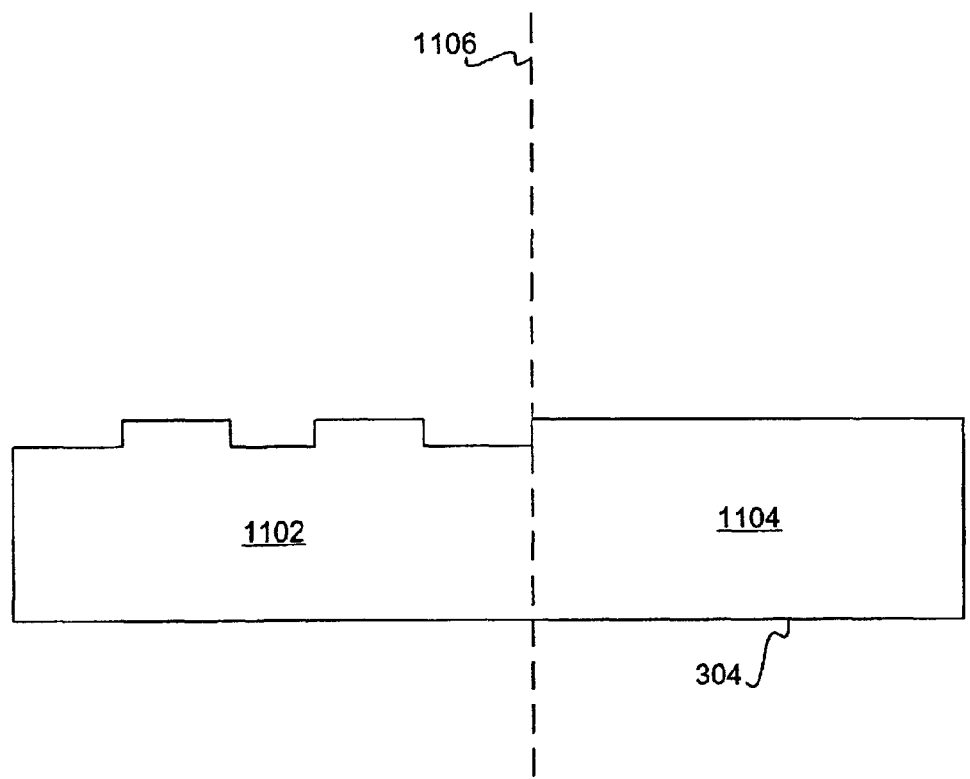
FIG. 11 is a diagram showing the improved planar uniformity resulting from the full image exposure process of FIG. 7 and the clear out process of FIG. 10.

FIG. 11 shows the more uniform planarization that results from the full image and clear out processes of the invention. The area 1102 of the field 304 corresponds to the part of the field 304 that does not include the alignment mark, whereas the area 1104 of the field 304 corresponds to the part of the field 304 having the alignment mark 308 (not shown in FIG. 11). The area 1104 has a height substantially equal to that of the area 1102, meaning that there is greater planar uniformity. This is as compared to the area 504 of FIG. 5 having a greater height than the area 502 of FIG. 5, resulting from the conventional partial image process and which causes a lack of planar uniformity.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method comprising:
   exposing a field of a semiconductor wafer having an alignment mark thereon using a full-image mask, such that the field, including the alignment mark thereon, is entirely exposed by an image of the mask; and,
   performing a clear out process around the alignment mark on the field of the semiconductor wafer to reveal the alignment mark, including exposing just the alignment mark on the field using an auxiliary mask.

2. The method of claim 1, wherein the full-image mask is a positive photoresist mask.

3. The method of claim 1, wherein the field is located at an edge of the semiconductor wafer.

4. The method of claim 1, wherein the field is located at one of an upper-right part and a lower-left part of an edge of the semiconductor wafer.

5. The method of claim 1, further initially comprising depositing photoresist on the field of the semiconductor wafer.

6. The method of claim 5, further comprising removing the photoresist that was exposed.

7. The method of claim 6, wherein removing the photoresist that was exposed comprises developing the photoresist that was exposed.

8. The method of claim 6, further comprising etching the semiconductor wafer.

9. The method of claim 8, further comprising removing the photoresist that was unexposed.

10. The method of claim 9, wherein removing the photoresist that was unexposed comprises stripping the photoresist that was unexposed.

11. A method for fabricating one or more semiconductor devices comprising:
    exposing a field of a semiconductor wafer having an alignment mark thereon using a full-image mask, such that the field, including the alignment mark thereon, is entirely exposed by an image of the mask; and,
    performing a clear out process around the alignment mark on the field of the semiconductor wafer to reveal the alignment mark, including exposing just the alignment mark on the field using an auxiliary mask,
    such that the one or more semiconductor devices fabricated using the method have greater planar uniformity as compared to using a partial-image exposure process on the field to maintain the alignment mark.

12. The method of claim 11, wherein the full-image mask is a positive photoresist mask.

13. The method of claim 11, wherein the field is located at an edge of the semiconductor wafer.

14. The method of claim 11, further comprising:
    prior to exposing the field of the semiconductor wafer, depositing photoresist on the field of the semiconductor wafer; and,
    developing the photoresist that was exposed.

15. The method of claim 14, further comprising:
    etching the semiconductor wafer; and,
    stripping the photoresist that was unexposed.

* * * * *